(12) United States Patent
Schaefer

(10) Patent No.: US 12,154,639 B2
(45) Date of Patent: Nov. 26, 2024

(54) MEMORY FAULT NOTIFICATION

(71) Applicant: Micron Technology, Inc., Boise, ID (US)

(72) Inventor: Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 205 days.

(21) Appl. No.: 17/851,721

(22) Filed: Jun. 28, 2022

(65) Prior Publication Data
US 2023/0420065 A1    Dec. 28, 2023

(51) Int. Cl.
*G11C 29/04* (2006.01)
(52) U.S. Cl.
CPC .................... *G11C 29/04* (2013.01)
(58) Field of Classification Search
CPC ..... G11C 29/04; G11C 29/022; G11C 29/028; G11C 2029/0409
See application file for complete search history.

(56) References Cited

U.S. PATENT DOCUMENTS

| | | | |
|---|---|---|---|
| 9,425,816 B1* | 8/2016 | Yang | H03M 1/066 |
| 2010/0097093 A1* | 4/2010 | Ricard | H03F 1/56 |
| | | | 326/30 |
| 2018/0270169 A1* | 9/2018 | Daugherty, III | H04L 49/555 |

* cited by examiner

*Primary Examiner* — Sultana Begum
(74) *Attorney, Agent, or Firm* — Holland & Hart LLP

(57) ABSTRACT

Methods, systems, and devices for memory fault notification are described. A memory device may receive a configuration corresponding to a circuit node of the memory device, where the circuit node may be selectively coupled with a set of resistors. The memory device may determine a fault condition and couple the circuit node to at least a first resistor based on determining the fault condition. The memory device may bias the circuit node to a first voltage value that satisfies a voltage threshold based on coupling the circuit node to the first resistor. The memory device may output an indication of a fault state to notify a host device that a fault has been detected.

25 Claims, 5 Drawing Sheets

MEMORY FAULT NOTIFICATION

FIELD OF TECHNOLOGY

The following relates to one or more systems for memory, including memory fault notification.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Some devices may perform various operations associated with memory fault notifications. For example, a memory device may determine an internal fault associated with one or more memory dies of the memory device (e.g., a refresh fault, a parity fault, a catastrophic fault). In some cases, the memory device may not provide any notification about the fault or may not provide any notification about the fault (e.g., buffer a fault notification) until after completing one or more operations (e.g., until the memory device is inactive). The memory device may notify a host device that the fault has occurred, for example, during a read process a duration after the fault has been detected. In some cases, however, due to a lack of a fault output that notifies a host device of a detected fault, the fault may go undetected by the host device. Failing to indicate the fault to the host device for a duration of time is unreliable (e.g., not satisfy a standard of reliability) and will cause errors to propagate, functionality to deteriorate, or an inability to operate, among other disadvantages, for the memory device.

The techniques described herein enable a memory device to notify a host device of a memory fault, which will result in a more reliable, safe, and efficient system. For example, a memory device may receive a configuration corresponding to a circuit node of the memory device to support operation for fault detection, where the circuit node may be selectively coupled with a set of resistors. In some cases, the configuration may indicate to perform a recalibration operation associated with an internal resistor of the memory device based on, such as to match (e.g., approximately match), a parameter (e.g., the impedance) of an external resistor. Additionally or alternatively, the configuration may indicate to output an indication of a fault state to notify a host device that a fault has been detected. The memory device may determine a fault condition (e.g., an internal fault associated with one or more memory dies) and couple the circuit node to at least another component (e.g., a first resistor) based on determining the fault condition and the configuration to notify the host device. The memory device may bias the circuit node to a first voltage value that satisfies a voltage threshold indicating a fault condition. The memory device may then output the indication of the fault state to the host device.

Features of the disclosure are initially described in the context of systems and dies as described with reference to FIGS. 1 and 2. Features of the disclosure are described in the context of a circuit as described with reference to FIG. 3. These and other features of the disclosure are further illustrated by and described with reference to an apparatus diagram and flowcharts that relate to memory fault notification as described with reference to FIGS. 4 and 5.

Figure 1:
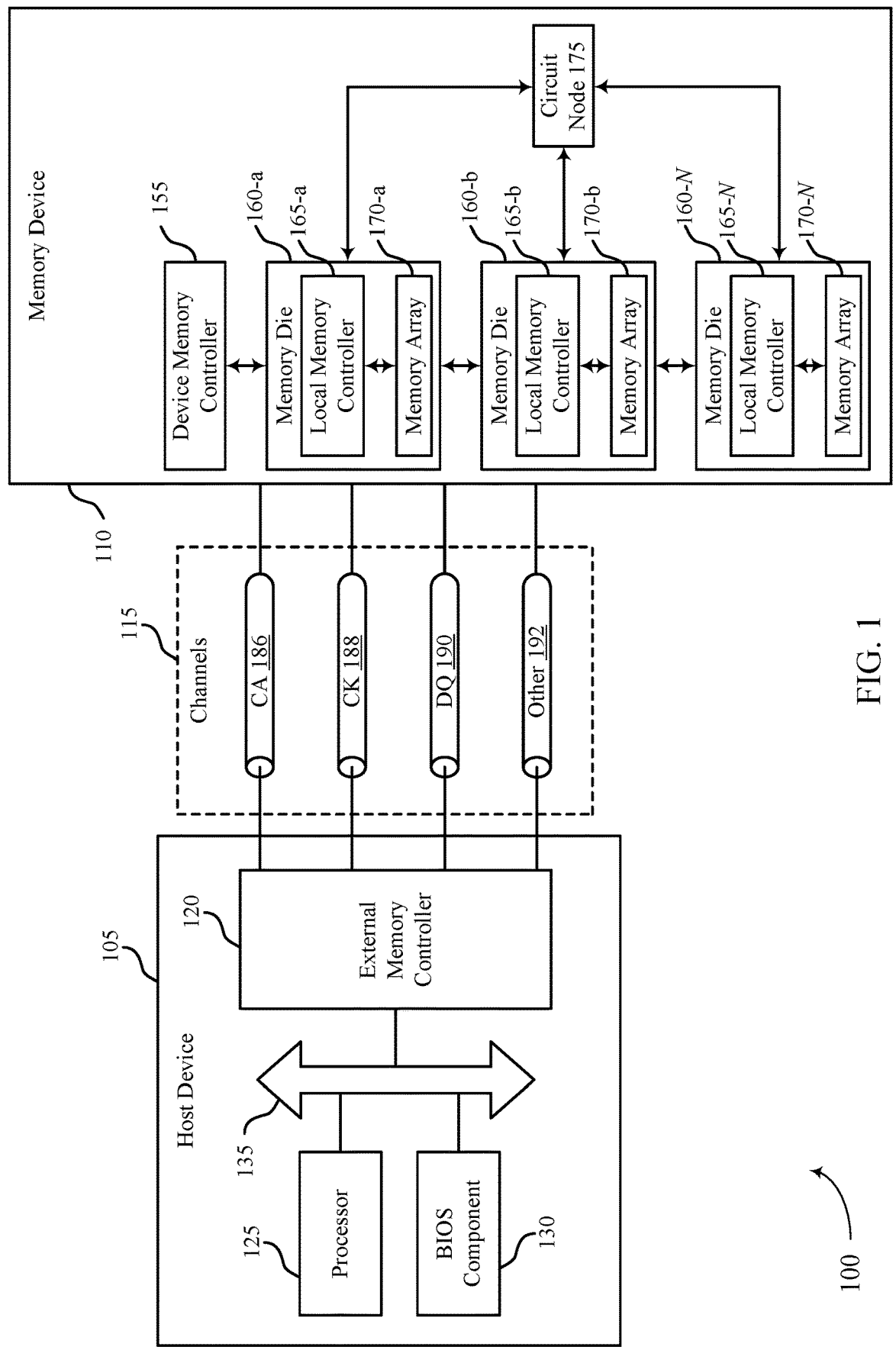
FIG. 1 illustrates an example of a system that supports memory fault notification in accordance with examples as disclosed herein.

FIG. 1 illustrates an example of a system 100 that supports memory fault notification in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, data channels 190 may be operable to communicate information (e.g., data, control information) between the host device 105 and the memory device 110. For example, the data channels 190 may communicate information (e.g., bi-directional) to be written to the memory device 110 or information read from the memory device 110.

In some examples, the one or more other channels 192 may include one or more error detection code (EDC) channels. The EDC channels may be operable to communicate error detection signals, such as checksums, to improve system reliability. An EDC channel may include any quantity of signal paths.

Some devices may perform various operations associated with memory fault notifications. For example, a memory device 110 may determine an internal fault associated with one or more memory dies 160 of the memory device 110 (e.g., a refresh fault, a parity fault, a catastrophic fault). In some cases, the memory device 110 may not provide any notification about the fault or may not provide any notification about the fault (e.g., buffer a fault notification) until completing one or more operations (e.g., until the memory device 110 is inactive). The memory device 110 may notify a host device 105 (e.g., via channels 115) that the fault has occurred, for example, during a read process a duration after the fault has been detected. In some cases, however, due to a lack of a fault output that notifies the host device 105 of a detected fault, the internal fault may go undetected by the host device. Failing to indicate the fault for a duration of time may be unreliable (e.g., not satisfy a standard of reliability) and will cause errors to propagate, functionality to deteriorate, or an inability to operate, among other disadvantages, for the memory device 110.

The techniques described herein enable a device, such as a memory device 110, to notify another device, such as a host device 105, of a memory fault, which will result in a more reliable, safe, and efficient system. For example, a memory device 110 may receive a configuration corresponding to a circuit node 175 of the memory device 110 to support optional operation for fault detection, where the circuit node 175 may be selectively coupled with one or more memory dies 160 (e.g., 160-a, 160-b, 160-N). In some cases, the configuration may indicate to perform a recalibration operation associated with an internal component (e.g., an internal resistor) of the memory device 110 to relate to, such as match (e.g., approximately match), a parameter of (e.g., the impedance of) an external component (e.g., such as an external resistor). Additionally, the configuration may indicate to output an indication of a fault state to notify the host device 105 that a fault has been detected. The memory device 110 may determine a fault condition (e.g., an internal fault associated with the one or more memory dies 160) and couple the circuit node 175 to at least a first resistor associated with a memory die 160 (e.g., memory die 160-a) based on determining the fault condition and the configuration to notify the host device 105. The memory device 110 may bias the circuit node to a first voltage value that satisfies a voltage threshold indicating a fault condition. The memory device 110 may then output the indication of the fault state to the host device 105.

Figure 2:
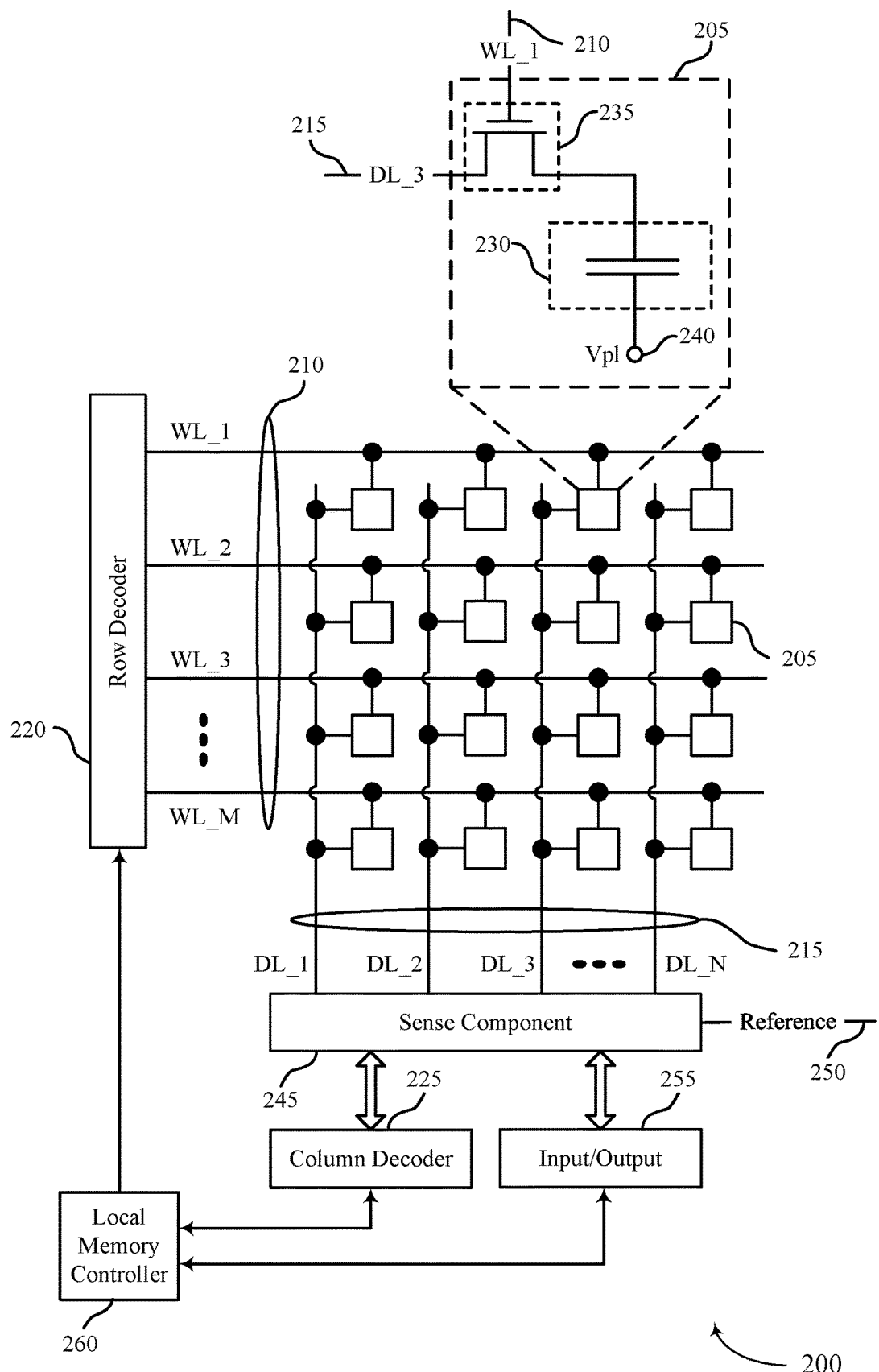
FIG. 2 illustrates an example of a memory die that supports memory fault notification in accordance with examples as disclosed herein.

FIG. 2 illustrates an example of a memory die 200 that supports memory fault notification in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. Dynamic read-only memory (DRAM) architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

Some devices may perform various operations associated with memory fault notifications. For example, a memory device 110 may determine an internal fault associated with one or more memory dies 200 (e.g., a memory die 160) of the memory device 110. In some cases, the memory device 110 may not provide any notification to a host device 105 of a detected fault, due to a lack of a fault output that notifies the host device 105. Failing to indicate the fault may be unreliable (e.g., not satisfy a standard of reliability) and will cause errors to propagate, functionality to deteriorate, or an inability to operate, among other disadvantages, for the memory device 110.

A device may notify another device of a memory fault to provide a more reliable, safe, and efficient system. For example, a memory device 110 may receive a configuration corresponding to a circuit node 175 of the memory device 110. The configuration may be associated with supporting optional operation for fault detection, where the circuit node 175 may be selectively coupled with a memory die 200 and one or more resistors. In some cases, the configuration may indicate to perform a recalibration operation associated with an internal resistor of the memory device 110 to match (e.g., approximately match), for example, the impedance of an external resistor. Additionally, the configuration may indicate to output an indication of a fault state to notify the host device 105 that a fault has been detected. The memory device 110 may determine a fault condition (e.g., an internal fault associated with one or more memory dies) and couple the circuit node 175 to at least a first resistor of one or more resistors based on determining the fault condition and the configuration to notify the host device 105. The memory device 110 may bias the circuit node 175 to a first voltage value that satisfies a voltage threshold indicating a fault condition. The memory device 110 may then output the indication of the fault state to the host device 105.

Figure 3A:
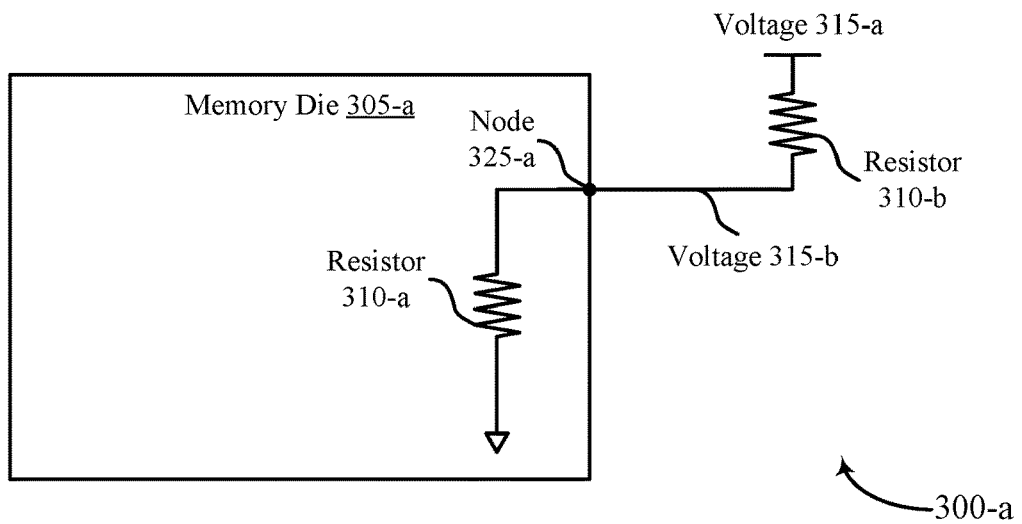
FIG. 3 illustrates an example of a circuit that supports memory fault notification in accordance with examples as disclosed herein.
Figure 3B:
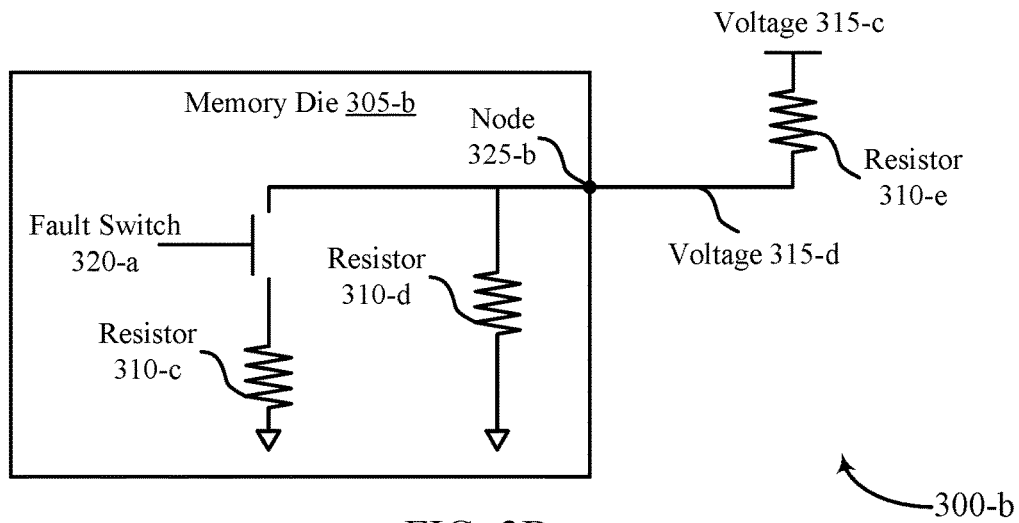
Figure 3C:
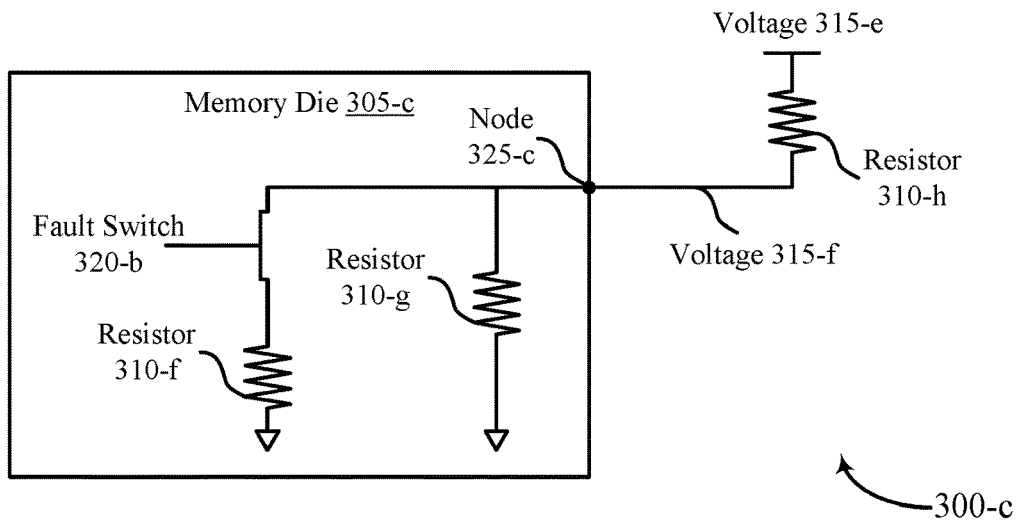

FIGS. 3A, 3B, and 3C illustrate examples of a circuit 300-a, a circuit 300-b, and a circuit 300-c respectively, that support memory fault notification in accordance with examples as disclosed herein. In some examples, the circuit 300-a, the circuit 300-b, and the circuit 300-c may be examples of or implement aspects of a system 100 or a memory die 200, as described herein with reference to FIGS. 1 and 2. For example, a memory die 305 and a node 325 may be examples of or included as part of a memory die 160 or a memory die 200, and a circuit node 175, respectively.

The circuits 300 may include multiple components such as a memory die 305, one or more resistors 310, a fault switch 320, a node 325, various connections (e.g., wires) connecting the multiple components, and various characteristics related to (e.g., voltages 315 across) the various connections. The multiple components may be examples of or implement aspects of components as described herein with reference to FIGS. 1 and 2. In some implementations, the circuits 300 may have additional types or quantities of components, and/or some components may be absent from the circuits 300. For example, the resistors 310 may represent a system of resistors (e.g., one or more resistors, a group of resistors, a resistor network). In some examples, operations described as being included or performed at one component or system may additionally or alternatively be performed at another component or system. In some examples, signaling or outputting an indication may be an example of a voltage or current between two components.

In some cases, the memory device 110 may determine a fault condition. For example, the memory device 110 may determine a refresh rate has been exceeded, an error correction code (ECC) error detection has been performed, an address command parity error has been determined, or another type of error (fault) may be determined. Some other devices (e.g., low-power DRAM (LPDRAM)) may lack a dedicated fault output (e.g., an error or fault pin or ball) and may not provide any notification about the determined fault condition while operating (e.g., wait until a read process to notify a host device 105 that a previous error (e.g., the fault condition) has occurred). But notifying the host device 105 of the previous error a relatively-long duration after the error has occurred may cause an unreliable, inefficient, and unsafe use condition, as well as relatively extensive background testing. For example, the memory device 110 may correspond to a device associated with functional safety or high reliability, availability, and serviceability (RAS) applications that may depend on a relatively low latency notification of memory faults (e.g., especially catastrophic errors). However, an additional independent fault component, such as an output pin, may be against some device standards (e.g., LPDRAM standardization group JEDEC).

The examples described with reference to FIGS. 3A, 3B, and 3C may depict examples of memory fault notification. In some implementations, the memory fault notification may advantageously exclude an additional independent fault output pin to conform with the device standards. In some examples, a memory device 110 may receive, from a host device 105, a configuration corresponding to a circuit node 325 of the memory device 110. In some cases, the circuit node 325 may be an example of a ZQ node and the configuration may indicate to the memory device 110 to perform a calibration operation with an optional alert functionality. For example, the calibration operation may be a ZQ operation for calibrating one or more internal components, such as resistors 310, of one or more memory dies 305. The node 325 (e.g., which may be the ZQ node) may be a DRAM (or other volatile memory) reference pin, among other examples. The memory device 110 may couple the node 325 of a first memory die 305 with an external resistor 310 coupled with a voltage source (e.g., $V_{DDQ}$) to support ZQ calibration (e.g., DRAM may perform ZQ calibration routines to match internal resistors to external resistors). For example, the memory device 110 may initiate the calibration operation and couple an internal resistor 310 of the first memory die 305 with the external resistor 310 via the node 325. In some cases, after the calibration operation, a voltage (e.g., $V_{ZQref}$) at the node 325 may be a fraction of the voltage source (e.g., approximately $V_{DDQ}/2$), thus indicating that the internal resistor 310 has been calibrated according to (e.g., matches, has an identical impedance value as) the external resistor 310.

In some cases, the memory device 110 may enable (e.g., initiate) the calibration operation based on the configuration. For example, as part of the calibration operation, the memory device 110 may initiate the coupling of the internal resistor 310 of the first memory die 305 with the node 325 and an external resistor 310 to the node 325. In some cases, the internal resistor 310 and the external resistor 310 may be in a series configuration. Based on the series configuration, if a resistance (e.g., impedance) value of the internal resistor 310 matches a resistance value of the external resistor 310, then the voltage at the node 325 may be the fraction of the voltage source ($V_{DDQ}/2$). If the internal resistor 310 has a resistance value different from the resistance value of the external resistor 310, then the voltage at the node 325 may be different from the voltage fraction. Based on the difference, the memory device 110 may adjust an initial resistance value of the internal resistor 310 to the resistance value associated with the external resistor 310 (e.g., approximately matching the impedance value of the internal resistor to the impedance value of the external resistor). For example, the memory device 110 may adjust the internal resistor 310 until the voltage at the node 325 satisfies a voltage threshold (e.g., $V_{ZQref} \approx V_{DDQ}/2$).

As described herein with reference to FIGS. 1 and 2, a memory device 110 may include one or more of multiple memory dies 305 configured to perform the calibration operation for a resistor of each memory die 305. For example, the memory device 110 may include a memory die 305-a, a memory die 305-b, a memory die 305-c, or any combination thereof.

In some cases, the memory die 305-*a*, the memory die 305-*b*, and the memory die 305-*c* may be examples of a single memory die 305 at distinct states of the calibration operation. For example, the memory die 305-*a* may be a representation of a memory device configured for the calibration operation, the memory die 305-*b* may be a representation of a memory device configured for the calibration operation with fault detection and notification (e.g., alert) capabilities, and the memory die 305-*c* may be a representation of a memory device configured for the calibration operation with fault detection and notification (e.g., alert) capabilities when a fault is detected. In some cases, the memory die 305-*a* may include a master component, such as a master pin, for the calibration operation (e.g., a ZQ calibration master pin). The master component may be used to communicate and convey information (e.g., handshake) with one or more other connected memory dies 305-*b* and/or 305-*c* (e.g., other connected DRAMs) such that a single memory die 305 may perform the calibration operation at a given time. For example, the memory die 305-*a* may perform the calibration operation. After the memory die 305-*a* completes the calibration operation, the master component, such as a master pin, may indicate (e.g., handshake) to the memory die 305-*b* to initiate the calibration operation. As such, the memory device 110 may perform the calibration operation for each memory die 305 separately. In some cases, to support the fault detection and notification functionality, the host device 105 may configured to leverage a component, such as a dedicated pin, per memory device 110 (e.g., one pin per DRAM package rather than one per memory die 305).

In the example of FIG. 3A, the memory die 305-*a* may include a node 325-*a*, a resistor 310-*a*, a resistor 310-*b*, various connections (e.g., wires) connecting the resistors 310, voltage 315-*a* corresponding to resistor 310-*b*, and voltage 315-*b* corresponding to the node 325-*a*. The memory die 305-*a* may be configured for the calibration operation. The memory device 110 may couple the resistor 310-*b* with the node 325-*a* and the node 325-*a* with the resistor 310-*b*. The memory device 110 may adjust a component, such as the resistor 310-*a*, until the voltage 315-*b* of the node 325-*a* (e.g., $V_{ZQref}$) is approximately equal to a second voltage value (e.g., $V_{DDQ}/2$) (e.g., within a voltage range of a first voltage value (e.g., the voltage 315-*a* (e.g., $V_{DDQ}$)) and the second voltage value), thus matching a resistance value of the resistor 310-*a* to a resistance value of the resistor 310-*b*. In some cases, the memory device voltage 315-*b* may be approximately equal to the voltage 315-*a*.

In the example of FIG. 3B, the memory die 305-*b* may include a node 325-*b* selectively coupled with a set of resistors 310, a resistor 310-*c*, a resistor 310-*d*, a resistor 310-*e*, various connections (e.g., wires) connecting the resistors 310, voltage 315-*c* corresponding to resistor 310-*e*, and voltage 315-*d* corresponding to the node 325-*b*. The memory die 305-*b* may be configured for the calibration operation with fault detection and notification capabilities. The memory device 110 may couple the resistor 310-*d* with the node 325-*b* and the node 325-*b* with the resistor 310-*e* while the resistor 310-*c* is decoupled from the node 325-*b*. In some examples, the memory device 110 may not detect a fault condition. The fault switch 320-*a* may remain decoupled (e.g., switched off) based on to the memory device 110 not detecting a fault condition. The memory device 110 and may adjust the resistor 310-*d* until the voltage 315-*d* of the node 325-*b* (e.g., $V_{ZQref}$) is approximately equal to a second voltage value (e.g., $V_{DDQ}/2$). The host device 105 may determine (e.g., monitor, detect) whether the node 325-*b* is approximately equal to the second voltage value, indicating that the resistor 310-*d* is calibrated according to the resistor 310-*e*. When the resistor 310-*d* has been calibrated, the memory device 110 may decouple the node 325-*b* (effectively decoupling the resistor 310-*d* from the resistor 310-*e*), and determine to proceed with the calibration operation at another memory die 305.

In the example of FIG. 3C, the memory die 305-*c* may include a node 325-*c* selectively coupled with a resistor 310-*f*, a resistor 310-*g*, a resistor 310-*h*, various connections (e.g., wires) connecting the resistors 310, voltage 315-*e* corresponding to resistor 310-*h*, and voltage 315-*f* corresponding to the node 325-*c*. The memory die 305-*c* may be configured for the calibration operation with fault detection and notification capabilities (e.g., including outputting an indication of a fault state for the memory device 110). The memory device 110 may couple the node 325-*c* to the resistor 310-*f* based on a fault condition associated with the memory device 110. For example, the memory device 110 may detect an internal fault (e.g., a refresh rate error, a command parity error) associated with the memory die 305-*c* and determine a fault state for the memory device 110. The fault switch 320-*b* may then couple (e.g., activate, switch on) with the node 325-*c* and the resistor 310-*f* based on detecting the internal fault. In some cases, the memory device 110 may bias the node 325-*c* to a first voltage value that satisfies a first voltage threshold based on coupling the node 325-*c* to the resistor 310-*f*. For example, the resistor 310-*f* may be in series with the resistor 310-*h* (e.g., an external resistor) when coupled with the node 325-*c*. The resistor 310-*f* may be a low impedance resistor that has a resistance value less than the resistor 310-*h* (e.g., much less than). Thus, when the fault condition is present and the fault switch 320-*b* is coupled with the resistor 310-*f* and the node 325-*c*, the node 325-*c* (e.g., a ZQ pin) may be pulled low internally by the resistor 310-*f* (e.g., the voltage 315-*f* may be reduced below the voltage threshold due to the resistor 310-*f* being in a series configuration with the resistor 310-*h*). In some cases, the resistor 310-*f* may be in parallel with the resistor 310-*g* and the resistor 310-*f* and the resistor 310-*g* may be in series with the resistor 310-*h*. For example, because the resistor 310-*f* and the resistor 310-*g* are in parallel, a voltage division (used to calculate the voltage value at the node 325-*c*) of the node 325-*c* that utilizes the resistor 310-*f* and the resistor 310-*g* may be approximately the same as a voltage division that only utilizes the resistor 310-*f* (e.g., the internal resistor 310-*g* may become obsolete due to the much lower impedance of the resistor 310-*f*). Because the resistor 310-*f* is in series with the resistor 310-*h*, the voltage value at the node 325-*c* may be significantly reduced (compared with a parallel configuration of the resistor 310-*f* and the resistor 310-*h*).

In some cases, the memory device 110 may output (e.g., implicitly output) an indication of the fault state for the memory device 110. For example, the memory device 110 may output an indication of the fault state to the host device 105. In some examples, the host device 105 may monitor the voltage 315-*f* of the node 325-*c* of the memory device 110. Because the node 325-*c* is pulled low by coupling the resistor 310-*f*, the memory device 110 may output and the host device 105 may observe the voltage 315-*f* being reduced below the voltage threshold (e.g., reduced to approximately a voltage divider between the resistor 310-*f* and the resistor 310-*h*) and determine that the memory device 110 is in a fault state (e.g., a fault condition has occurred). In some cases, the host device 105 may observe multiple indications of various types of fault states. For example, the resistor 310-*f* may include a network of resistors 310-*f* where each resistor 310-*f* may be selectively coupled with the node 325-*c* based on a type of fault condition (e.g., a catastrophic fault or a low impact fault). Based on which (e.g., how many) of the resistors 310-*f* are coupled with the node 325-*c*, the voltage 315-*f* may satisfy a first voltage threshold associated with a first type of fault, a second voltage threshold associated with a second type of fault, or another voltage threshold. The host device 105 may determine the type of fault based on which voltage threshold has been satisfied. In some implementations, the voltage thresholds may be a range of voltage values.

In some implementations, the calibration operation may be disabled (e.g., by the memory device 110, by the host device 105) due to detecting the fault condition. For example, the memory device 110 may detect the fault condition associated with the memory die 305-*c* and disable (e.g., halt, stop) the calibration operation for the memory die 305-*a*, the memory die 305-*b*, and the memory die 305-*c*. In some cases, the memory device 110 may detect the fault condition associated with the memory die 305-*c* and disable the calibration operation for the memory die 305-*c*. The memory device 110 may determine (e.g., enter into) a fault state based on the fault condition. In some examples, the memory device 110 may continue the calibration operation after the memory device 110 enters an operation state (e.g., moves from the fault state to an operation state when the fault has been removed).

Figure 4:
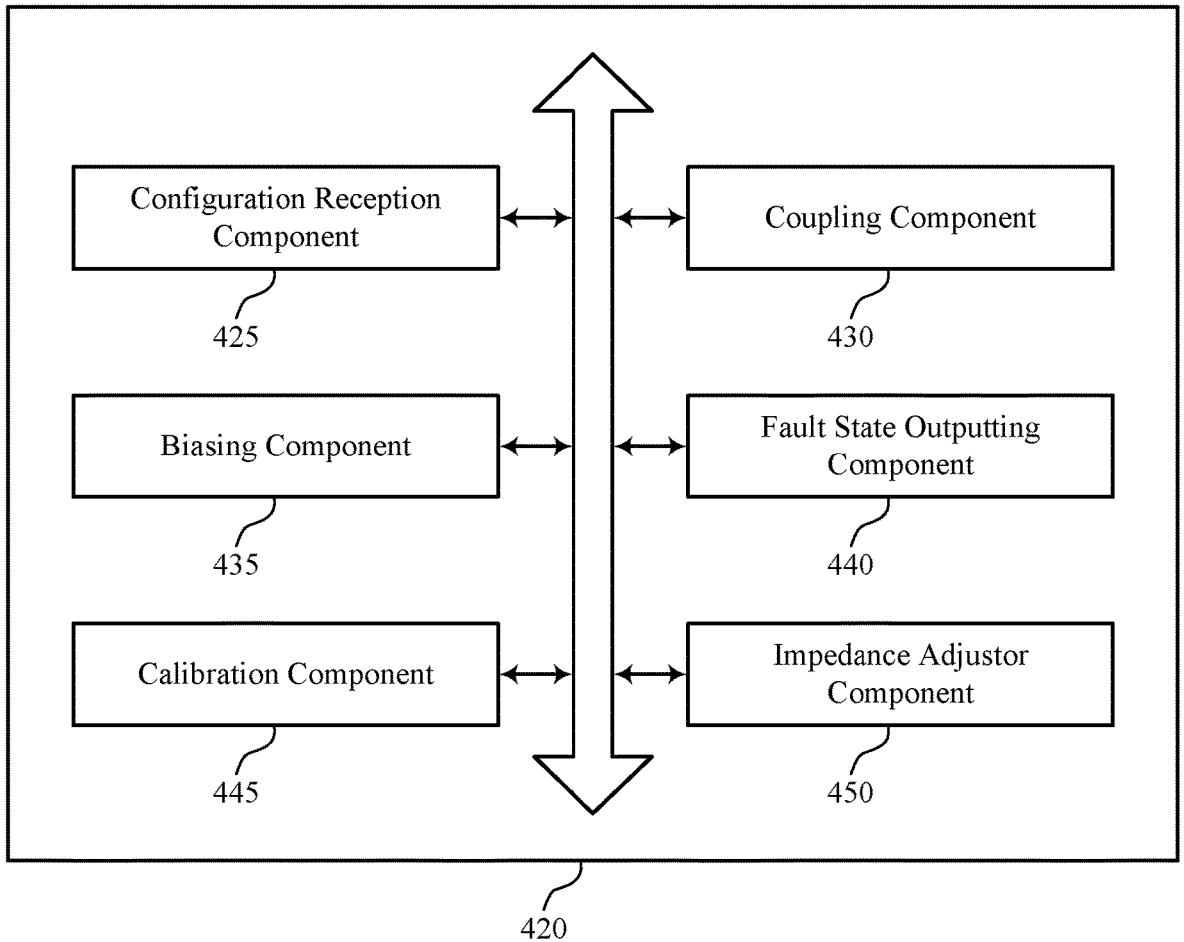
FIG. 4 shows a block diagram of a memory device that supports memory fault notification in accordance with examples as disclosed herein.

FIG. 4 shows a block diagram 400 of a memory device 420 that supports memory fault notification in accordance with examples as disclosed herein. The memory device 420 may be an example of aspects of a memory device as described with reference to FIGS. 1 through 3. The memory device 420, or various components thereof, may be an example of means for performing various aspects of memory fault notification as described herein. For example, the memory device 420 may include a configuration reception component 425, a coupling component 430, a biasing component 435, a fault state outputting component 440, a calibration component 445, an impedance adjustor component 450, or any combination thereof. Each of these components may communicate, directly or indirectly, with one another (e.g., via one or more buses).

The configuration reception component 425 may be configured as or otherwise support a means for receiving a configuration for a memory device, the configuration corresponding to a circuit node of the memory device, the circuit node selectively coupled with a set of resistors associated with the memory device. The coupling component 430 may be configured as or otherwise support a means for coupling the circuit node to a first resistor of the set of resistors based at least in part on a fault condition associated with the memory device. The biasing component 435 may be configured as or otherwise support a means for biasing the circuit node of the memory device to a first voltage value satisfying a first voltage threshold based at least in part on coupling the circuit node to the first resistor.

In some examples, the fault state outputting component 440 may be configured as or otherwise support a means for outputting an indication of a fault state for the memory device based at least in part on the detected fault condition associated with the memory device.

In some examples, the configuration includes an indication to perform a calibration operation including outputting the indication of the fault state for the memory device.

In some examples, the calibration component 445 may be configured as or otherwise support a means for enabling a calibration operation for the memory device based at least in part on the configuration. In some examples, the coupling component 430 may be configured as or otherwise support a means for coupling, while the first resistor is decoupled from the circuit node, the circuit node of the memory device with a second resistor of the set of resistors, the second resistor in parallel with the first resistor. In some examples, the coupling component 430 may be configured as or otherwise support a means for coupling the circuit node of the memory device with a third resistor external to the memory device, the third resistor in series with the first resistor and the second resistor. In some examples, the impedance adjustor component 450 may be configured as or otherwise support a means for adjusting a first resistance value of the second resistor to a second resistance value associated with the third resistor. In some examples, the biasing component 435 may be configured as or otherwise support a means for biasing the circuit node to a second voltage value satisfying a second voltage threshold different than the first voltage threshold based at least in part on the adjusting.

In some examples, the second voltage value is within a voltage range including a plurality of voltage values between a third voltage value and a fourth voltage value. In some examples, the fourth voltage value is a fraction of the third voltage value.

In some examples, the memory device includes a plurality of memory die. In some examples, the memory device performs the calibration operation for each memory die of the plurality of memory die separately.

In some examples, the calibration component 445 may be configured as or otherwise support a means for disabling a calibration operation for the memory device based at least in part on the detected fault condition. In some examples, the coupling component 430 may be configured as or otherwise support a means for coupling the circuit node of the memory device with a second resistor of the set of resistors, the second resistor in parallel with the first resistor. In some examples, the coupling component 430 may be configured as or otherwise support a means for coupling the circuit node of the memory device with a third resistor external to the memory device, the third resistor in series with the first resistor and the second resistor. In some examples, the impedance adjustor component 450 may be configured as or otherwise support a means for adjusting a first resistance value of the second resistor to a second resistance value associated with the third resistor. In some examples, the biasing component 435 may be configured as or otherwise support a means for biasing the circuit node to a second voltage value that satisfies a second voltage threshold different than the first voltage threshold based at least in part on the adjusting.

In some examples, the calibration component 445 may be configured as or otherwise support a means for disabling the calibration operation based at least in part on a fault state associated with the detected fault condition.

In some examples, to support disabling the calibration operation for the memory device, the calibration component 445 may be configured as or otherwise support a means for disabling the calibration operation for a first memory die of the memory device associated with the second resistor based at least in part on the configuration.

In some examples, the first voltage value is based at least in part on the first resistor in series with a third resistor external to the memory device.

In some examples, the memory device corresponds to a device associated with functional safety or high reliability, availability, and serviceability applications.

In some examples, the fault condition includes a DRAM memory fault.

Figure 5:
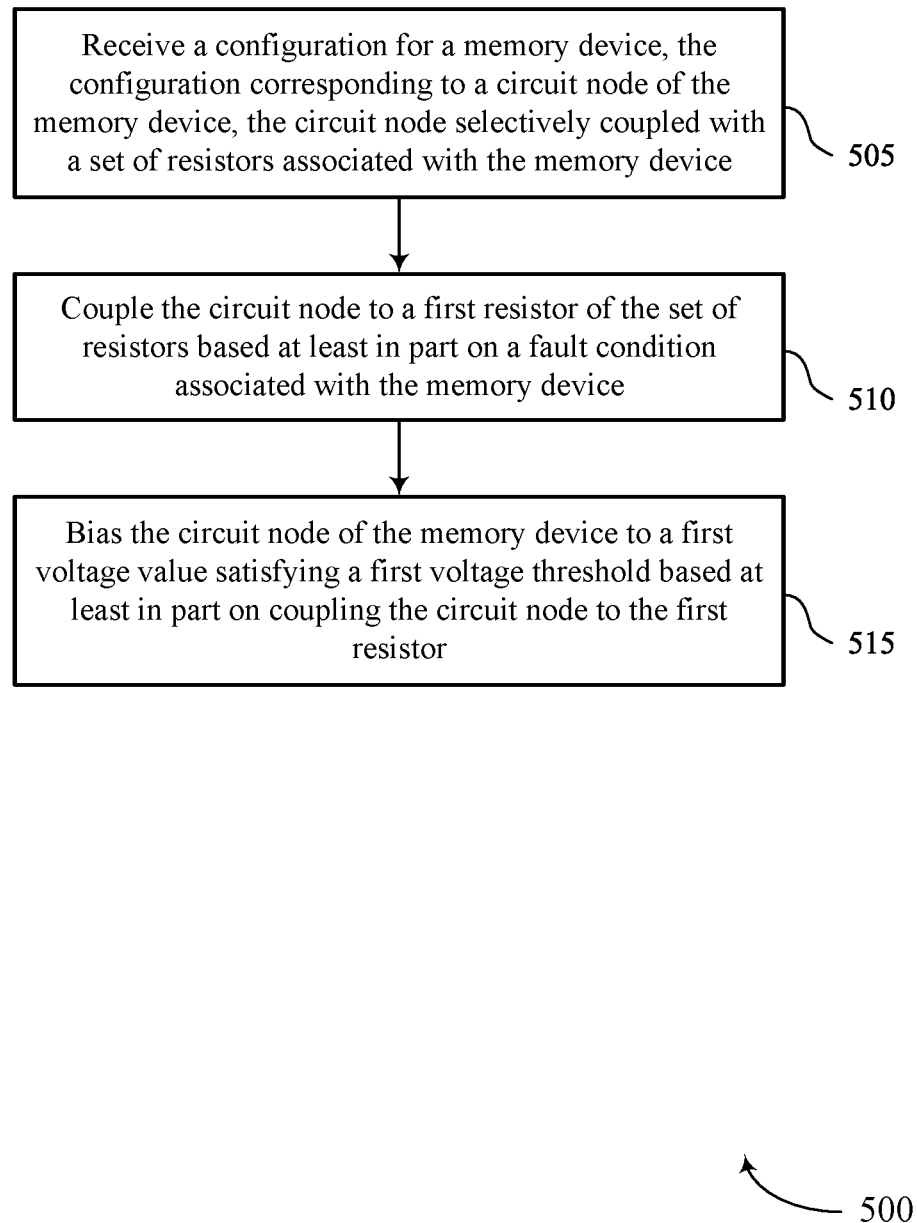
FIG. 5 shows a flowchart illustrating a method or methods that support memory fault notification in accordance with examples as disclosed herein.

FIG. 5 shows a flowchart illustrating a method 500 that supports memory fault notification in accordance with examples as disclosed herein. The operations of method 500 may be implemented by a memory device or its components as described herein. For example, the operations of method 500 may be performed by a memory device as described with reference to FIGS. 1 through 4. In some examples, a memory device may execute a set of instructions to control the functional elements of the device to perform the described functions. Additionally, or alternatively, the memory device may perform aspects of the described functions using special-purpose hardware.

At 505, the method may include receiving a configuration for a memory device, the configuration corresponding to a circuit node of the memory device, the circuit node selectively coupled with a set of resistors associated with the memory device. The operations of 505 may be performed in accordance with examples as disclosed herein. In some examples, aspects of the operations of 505 may be performed by a configuration reception component 425 as described with reference to FIG. 4.

At 510, the method may include coupling the circuit node to a first resistor of the set of resistors based at least in part on a fault condition associated with the memory device. The operations of 510 may be performed in accordance with examples as disclosed herein. In some examples, aspects of the operations of 510 may be performed by a coupling component 430 as described with reference to FIG. 4.

At 515, the method may include biasing the circuit node of the memory device to a first voltage value satisfying a first voltage threshold based at least in part on coupling the circuit node to the first resistor. The operations of 515 may be performed in accordance with examples as disclosed herein. In some examples, aspects of the operations of 515 may be performed by a biasing component 435 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a configuration for a memory device, the configuration corresponding to a circuit node of the memory device, the circuit node selectively coupled with a set of resistors associated with the memory device; coupling the circuit node to a first resistor of the set of resistors based at least in part on a fault condition associated with the memory device; and biasing the circuit node of the memory device to a first voltage value satisfying a first voltage threshold based at least in part on coupling the circuit node to the first resistor.

Aspect 2: The method, apparatus, or non-transitory computer-readable medium of aspect 1, further including operations, features, circuitry, logic, means, or instructions, or any combination thereof for outputting an indication of a fault state for the memory device based at least in part on the detected fault condition associated with the memory device.

Aspect 3: The method, apparatus, or non-transitory computer-readable medium of aspect 2, where the configuration includes an indication to perform a calibration operation including outputting the indication of the fault state for the memory device.

Aspect 4: The method, apparatus, or non-transitory computer-readable medium of any of aspects 1 through 3, further including operations, features, circuitry, logic, means, or instructions, or any combination thereof for enabling a calibration operation for the memory device based at least in part on the configuration, the calibration operation including; coupling, while the first resistor is decoupled from the circuit node, the circuit node of the memory device with a second resistor of the set of resistors, the second resistor in parallel with the first resistor; coupling the circuit node of the memory device with a third resistor external to the memory device, the third resistor in series with the first resistor and the second resistor; adjusting a first resistance value of the second resistor to a second resistance value associated with the third resistor; and biasing the circuit node to a second voltage value satisfying a second voltage threshold different than the first voltage threshold based at least in part on the adjusting.

Aspect 5: The method, apparatus, or non-transitory computer-readable medium of aspect 4, where the second voltage value is within a voltage range including a plurality of voltage values between a third voltage value and a fourth voltage value and the fourth voltage value is a fraction of the third voltage value.

Aspect 6: The method, apparatus, or non-transitory computer-readable medium of any of aspects 4 through 5, where the memory device includes a plurality of memory die and the memory device performs the calibration operation for each memory die of the plurality of memory die separately.

Aspect 7: The method, apparatus, or non-transitory computer-readable medium of any of aspects 1 through 6, further including operations, features, circuitry, logic, means, or instructions, or any combination thereof for disabling a calibration operation for the memory device based at least in part on the detected fault condition, the calibration operation including; coupling the circuit node of the memory device with a second resistor of the set of resistors, the second resistor in parallel with the first resistor; coupling the circuit node of the memory device with a third resistor external to the memory device, the third resistor in series with the first resistor and the second resistor; adjusting a first resistance value of the second resistor to a second resistance value associated with the third resistor; and biasing the circuit node to a second voltage value that satisfies a second voltage threshold different than the first voltage threshold based at least in part on the adjusting.

Aspect 8: The method, apparatus, or non-transitory computer-readable medium of aspect 7, further including operations, features, circuitry, logic, means, or instructions, or any combination thereof for disabling the calibration operation based at least in part on a fault state associated with the detected fault condition.

Aspect 9: The method, apparatus, or non-transitory computer-readable medium of aspect 8, where disabling the calibration operation for the memory device further includes operations, features, circuitry, logic, means, or instructions, or any combination thereof for disabling the calibration operation for a first memory die of the memory device associated with the second resistor based at least in part on the configuration.

Aspect 10: The method, apparatus, or non-transitory computer-readable medium of any of aspects 1 through 9, where the first voltage value is based at least in part on the first resistor in series with a third resistor external to the memory device.

Aspect 11: The method, apparatus, or non-transitory computer-readable medium of any of aspects 1 through 10, where the memory device corresponds to a device associated with functional safety or high reliability, availability, and serviceability applications.

Aspect 12: The method, apparatus, or non-transitory computer-readable medium of any of aspects 1 through 11, where the fault condition includes a DRAM memory fault.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 13: An apparatus, including: a circuit including a set of resistors; a switch operable to couple one or more resistors of the set of resistors to a circuit node; and a controller operable to cause the apparatus to: receive a configuration for the apparatus, the configuration corresponding to the circuit node of the circuit; couple the circuit node to a first resistor of the set of resistors based at least in part on detecting a fault condition associated with the apparatus; and bias the circuit node of the circuit to a first voltage value based at least in part on the coupling, the first voltage value satisfying a first voltage threshold.

Aspect 14: The apparatus of aspect 13, where: the first resistor operable to bias the circuit node to the first voltage value; the switch operable to couple the first resistor with the circuit node based at least in part on detecting the fault condition, and where the circuit further includes: a second resistor in parallel with the first resistor and operable to bias the circuit node to the first voltage value; and a third resistor in series with the first resistor and the second resistor.

Aspect 15: The apparatus of aspect 14, where: the first resistor is a low impedance resistor, the second resistor is an internal resistor, and the third resistor is an external resistor operable as a reference for the second resistor.

Aspect 16: The apparatus of any of aspects 13 through 15, where the apparatus includes two or more memory die and the controller is further operable to cause the apparatus to: enable a calibration operation for each memory die of the apparatus based at least in part on the configuration, the controller further operable to initiate each calibration operation consecutively and cause the apparatus to: couple the circuit node with a second resistor of the set of resistors and a third resistor; adjust a first resistance value of the second resistor to a second resistance value associated with the third resistor; and bias the circuit node to a second voltage value satisfying a second voltage threshold different than the first voltage threshold based at least in part on the second resistance value.

Aspect 17: The apparatus of any of aspects 13 through 16, where the apparatus includes two or more memory die and the controller is further operable to cause the apparatus to: disable a calibration operation for each memory die of the apparatus based at least in part on the detected fault condition, the controller further operable to halt each calibration operation and cause the apparatus to: decouple the circuit node from a second resistor of the set of resistors and a third resistor; and bias the circuit node to a second voltage value based at least in part on decoupling the second resistor.

An apparatus is described. The following provides an overview of aspects of the apparatus as described herein:

Aspect 18: An apparatus, including: a memory device; and a controller configured to couple with the memory device and configured to cause the apparatus to: receive a configuration for a memory device, the configuration corresponding to a circuit node of the memory device, the circuit node selectively coupled with a set of resistors associated with the memory device; couple the circuit node to a first resistor of the set of resistors based at least in part on detecting a fault condition associated with the memory device; and bias the circuit node of the memory device to a first voltage value satisfying a first voltage threshold based at least in part on coupling the circuit node to the first resistor, the first voltage value.

Aspect 19: The apparatus of aspect 18, where the controller is further configured to cause the apparatus to: outputting an indication of a fault state for the memory device based at least in part on the detected fault condition associated with the memory device.

Aspect 20: The apparatus of any of aspects 18 through 19, where the controller is further configured to cause the apparatus to: enable a calibration operation for the memory device based at least in part on the configuration, the calibration operation including: coupling the circuit node of the memory device with a second resistor of the set of resistors, the second resistor in parallel with the first resistor; coupling the circuit node of the memory device with a third resistor external to the memory device, the third resistor in series with the first resistor and the second resistor; adjusting a first resistance value of the second resistor to a second resistance value associated with the third resistor; and biasing the circuit node to a second voltage value satisfying a second voltage threshold different than the first voltage threshold based at least in part on the adjusting.

Aspect 21: The apparatus of aspect 20, where the second voltage value is within a voltage range including a plurality of voltage values between a third voltage value and a fourth voltage value, and the fourth voltage value is a fraction of the third voltage value.

Aspect 22: The apparatus of aspect 21, where the memory device includes a plurality of memory die, and the memory device performs the calibration operation for each memory die of the plurality of memory die separately.

Aspect 23: The apparatus of any of aspects 18 through 22, where the controller is further configured to cause the apparatus to: disable a calibration operation for the memory device based at least in part on the detected fault condition, the calibration operation including: coupling the circuit node of the memory device with a second resistor of the set of resistors, the second resistor in parallel with the first resistor; coupling the circuit node of the memory device with a third resistor external to the memory device, the third resistor in series with the first resistor and the second resistor; adjusting a first resistance value of the second resistor to a second resistance value associated with the third resistor; and biasing the circuit node to a second voltage value that satisfies a second voltage threshold different than the first voltage threshold based at least in part on the adjusting.

Aspect 24: The apparatus of aspect 23, where the controller is further configured to cause the apparatus to: disable the calibration operation based at least in part on a fault state associated with the detected fault condition.

Aspect 25: The apparatus of aspect 24, where the controller configured to cause the apparatus to disable calibration operation for the memory device is further configured to cause the apparatus to: disable the calibration operation for a first memory die of the memory device associated with the second resistor based at least in part on the configuration.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
  receiving a configuration for a memory device, the configuration corresponding to a circuit node of the memory device, the circuit node selectively coupled with a set of resistors associated with the memory device;
  coupling the circuit node to a first resistor of the set of resistors based at least in part on a fault condition associated with the memory device; and
  biasing the circuit node of the memory device to a first voltage value satisfying a first voltage threshold based at least in part on coupling the circuit node to the first resistor.

2. The method of claim 1, further comprising:
  outputting an indication of a fault state for the memory device based at least in part on the fault condition associated with the memory device.

3. The method of claim 2, wherein the configuration comprises an indication to perform a calibration operation including outputting the indication of the fault state for the memory device.

4. The method of claim 1, further comprising:
  enabling a calibration operation for the memory device based at least in part on the configuration, the calibration operation comprising:
  coupling, while the first resistor is decoupled from the circuit node, the circuit node of the memory device with a second resistor of the set of resistors, the second resistor in parallel with the first resistor;
  coupling the circuit node of the memory device with a third resistor external to the memory device, the third resistor in series with the first resistor and the second resistor;
  adjusting a first resistance value of the second resistor to a second resistance value associated with the third resistor; and
  biasing the circuit node to a second voltage value satisfying a second voltage threshold different than the first voltage threshold based at least in part on the adjusting.

5. The method of claim 4, wherein:
  the second voltage value is within a voltage range comprising a plurality of voltage values between a third voltage value and a fourth voltage value, and
  the fourth voltage value is a fraction of the third voltage value.

6. The method of claim 4, wherein:
  the memory device comprises a plurality of memory die, and
  the memory device performs the calibration operation for each memory die of the plurality of memory die separately.

7. The method of claim 1, further comprising:
  disabling a calibration operation for the memory device based at least in part on the fault condition, the calibration operation comprising:
  coupling the circuit node of the memory device with a second resistor of the set of resistors, the second resistor in parallel with the first resistor;
  coupling the circuit node of the memory device with a third resistor external to the memory device, the third resistor in series with the first resistor and the second resistor;
  adjusting a first resistance value of the second resistor to a second resistance value associated with the third resistor; and
  biasing the circuit node to a second voltage value that satisfies a second voltage threshold different than the first voltage threshold based at least in part on the adjusting.

8. The method of claim 7, further comprising:
  disabling the calibration operation based at least in part on a fault state associated with the fault condition.

9. The method of claim 8, wherein disabling the calibration operation for the memory device further comprises:
disabling the calibration operation for a first memory die of the memory device associated with the second resistor based at least in part on the configuration.

10. The method of claim 1, wherein the first voltage value is based at least in part on the first resistor in series with a third resistor external to the memory device.

11. The method of claim 1, wherein the memory device corresponds to a device associated with functional safety or high reliability, availability, and serviceability applications.

12. The method of claim 1, wherein the fault condition comprises a dynamic random access memory (DRAM) memory fault.

13. A memory system, comprising:
a circuit comprising a set of resistors;
a switch operable to couple one or more resistors of the set of resistors to a circuit node; and
processing circuitry operable to cause the memory system to:
receive a configuration for a memory device of the memory system, the configuration corresponding to the circuit node of the circuit;
couple the circuit node to a first resistor of the set of resistors based at least in part on detecting a fault condition associated with the memory device; and
bias the circuit node of the circuit to a first voltage value based at least in part on the coupling, the first voltage value satisfying a first voltage threshold.

14. The memory system of claim 13, wherein:
the first resistor is operable to bias the circuit node to the first voltage value; and
the switch is operable to couple the first resistor with the circuit node based at least in part on detecting the fault condition, and wherein the circuit further comprises:
a second resistor in parallel with the first resistor and operable to bias the circuit node to the first voltage value; and
a third resistor in series with the first resistor and the second resistor.

15. The memory system of claim 14, wherein:
the first resistor is a low impedance resistor, the second resistor is an internal resistor, and the third resistor is an external resistor operable as a reference for the second resistor.

16. The memory system of claim 13, wherein the memory device comprises two or more memory die and the processing circuitry is further operable to cause the memory system to:
enable a calibration operation for each memory die of the memory device based at least in part on the configuration, the processing circuitry further operable to initiate each calibration operation consecutively and cause the memory system to:
couple the circuit node with a second resistor of the set of resistors and a third resistor;
adjust a first resistance value of the second resistor to a second resistance value associated with the third resistor; and
bias the circuit node to a second voltage value satisfying a second voltage threshold different than the first voltage threshold based at least in part on the second resistance value.

17. The memory system of claim 13, wherein the memory device comprises two or more memory die and the processing circuitry is further operable to cause the memory system to:
disable a calibration operation for each memory die of the memory device based at least in part on the detected fault condition, the processing circuitry further operable to halt each calibration operation and cause the memory system to:
decouple the circuit node from a second resistor of the set of resistors and a third resistor; and
bias the circuit node to a second voltage value based at least in part on decoupling the second resistor.

18. A memory system, comprising:
one or more memory devices; and
processing circuitry configured to couple with the one or more memory devices and configured to cause the memory system to:
receive a configuration for a memory device of the one or more memory devices, the configuration corresponding to a circuit node of the memory device, the circuit node selectively coupled with a set of resistors associated with the memory device;
couple the circuit node to a first resistor of the set of resistors based at least in part on detecting a fault condition associated with the memory device; and
bias the circuit node of the memory device to a first voltage value satisfying a first voltage threshold based at least in part on coupling the circuit node to the first resistor, the first voltage value.

19. The memory system of claim 18, wherein the processing circuitry is further configured to cause the memory system to:
output an indication of a fault state for the memory device based at least in part on the detected fault condition associated with the memory device.

20. The memory system of claim 18, wherein the processing circuitry is further configured to cause the memory system to:
enable a calibration operation for the memory device based at least in part on the configuration, the calibration operation comprising:
coupling the circuit node of the memory device with a second resistor of the set of resistors, the second resistor in parallel with the first resistor;
coupling the circuit node of the memory device with a third resistor external to the memory device, the third resistor in series with the first resistor and the second resistor;
adjusting a first resistance value of the second resistor to a second resistance value associated with the third resistor; and
biasing the circuit node to a second voltage value satisfying a second voltage threshold different than the first voltage threshold based at least in part on the adjusting.

21. The memory system of claim 20, wherein:
the second voltage value is within a voltage range comprising a plurality of voltage values between a third voltage value and a fourth voltage value, and the fourth voltage value is a fraction of the third voltage value.

22. The memory system of claim 21, wherein:
the memory device comprises a plurality of memory die, and the memory device performs the calibration operation for each memory die of the plurality of memory die separately.

23. The memory system of claim 18, wherein the processing circuitry is further configured to cause the memory system to:

disable a calibration operation for the memory device based at least in part on the detected fault condition, the calibration operation comprising:
- coupling the circuit node of the memory device with a second resistor of the set of resistors, the second resistor in parallel with the first resistor;
- coupling the circuit node of the memory device with a third resistor external to the memory device, the third resistor in series with the first resistor and the second resistor;
- adjusting a first resistance value of the second resistor to a second resistance value associated with the third resistor; and
- biasing the circuit node to a second voltage value that satisfies a second voltage threshold different than the first voltage threshold based at least in part on the adjusting.

24. The memory system of claim 23, wherein the processing circuitry is further configured to cause the memory system to:
- disable the calibration operation based at least in part on a fault state associated with the detected fault condition.

25. The memory system of claim 24, wherein the processing circuitry configured to cause the memory system to disable the calibration operation for the memory device is further configured to cause the memory system to:
- disable the calibration operation for a first memory die of the memory device associated with the second resistor based at least in part on the configuration.

* * * * *